United States Patent [19]

Cipolla et al.

[11] Patent Number: 5,052,606
[45] Date of Patent: Oct. 1, 1991

[54] TAPE AUTOMATED BONDING FEEDER

[75] Inventors: Thomas M. Cipolla, Hopewell Junction; Raymond R. Horton, Dover Plains; Alphonso P. Lanzetta, Marlboro; Michael J. Palmer, Walden, all of N.Y.; Mark B. Ritter, Brookfield, Conn.

[73] Assignee: International Business Machines Corp., Armonk, N.Y.

[21] Appl. No.: 546,496

[22] Filed: Jun. 29, 1990

[51] Int. Cl.⁵ .............................................. B65H 17/36
[52] U.S. Cl. .................................... 226/120; 226/149; 226/162; 156/552
[58] Field of Search ........................... 156/552; 221/71; 74/128; 83/277; 226/120, 8, 149, 150, 167, 161, 162

[56] References Cited

U.S. PATENT DOCUMENTS

| | | | |
|---|---|---|---|
| 3,735,907 | 5/1973 | Kuchar et al. | 226/150 |
| 3,753,522 | 8/1973 | Voges | 226/141 |
| 3,791,567 | 2/1974 | Schott, Jr. | 226/112 |
| 3,937,388 | 2/1976 | Zimmerman | 228/222 |
| 3,998,370 | 12/1976 | Grimland | 226/150 |
| 4,095,733 | 6/1978 | Scribner | 226/162 |
| 4,194,673 | 3/1980 | Elbert | 228/219 |
| 4,218,004 | 8/1980 | Rouse | 226/149 |
| 4,304,347 | 12/1981 | Finzer et al. | 226/150 |
| 4,326,658 | 4/1982 | Stoll | 226/141 |
| 4,493,447 | 1/1985 | Ledgerwood | 226/150 |
| 4,513,899 | 4/1985 | Ledgerwood | 226/199 X |
| 4,580,710 | 4/1986 | Ledgerwood | 226/141 |
| 4,619,390 | 10/1986 | Scribner | 226/162 |
| 4,851,902 | 7/1989 | Tezuka et al. | 358/101 |
| 4,875,614 | 10/1989 | Cipolla et al. | 228/5.5 |

FOREIGN PATENT DOCUMENTS 1236375 6/1971 United Kingdom ................ 226/162

Primary Examiner—Daniel P. Stodola
Assistant Examiner—P. Bowen
Attorney, Agent, or Firm—Perman & Green

[57] ABSTRACT

A hitch feeder for a TAB tape is described which comprises: a stationary jas assembly having opposing jaws for gripping edges of the tape when closed, and not gripping the edges when open; a movable gripping assembly which includes a lower movable gripper positioned below the tape and an upper movable gripper positioned above the tape. The lower and upper movable grippers may be moved both towards and away from the tape, each said movable gripper gripping the tape when moved towards it and releasing the tape when moved away from it. Both grippers are physically clear of any features on the tape when moved away from it. A tape feeder is provided for reciprocally moving the movable gripper assembly along the tape length, both towards and away from the stationary jaw assembly. A feed control is operative when the movable gripping assembly moves towards the stationary jaw assembly, to move the gripper jaws to grip the tape and to open the opposing jaws, and is further operative when the movable gripper assembly moves away from the stationary jaw assembly, to move the gripper jaws away from the tape and to close the opposing jaws.

16 Claims, 6 Drawing Sheets

TAPE AUTOMATED BONDING FEEDER

FIELD OF THE INVENTION

This invention relates to web feeding and, more particularly, to an incremental transfer mechanism for accurately moving a TAB tape into and out of a semiconductor chip bond site location.

BACKGROUND OF THE INVENTION

In tape automated bonding (TAB) packaging technology, a set of beam leads (a "lead frame") electrically interconnects a semiconductor chip to a wiring substrate, for instance, a printed circuit board. The beam leads are supported on a polymer substrate and the combination is called a TAB tape. Each frame of the TAB tape contains a new set of beam leads.

Each lead frame further includes an inner lead bond area where individual beam leads are aligned with a chip's contact locations, and an outer lead bond area for electrically interconnecting the chip to a substrate. A heated bonding head ("thermode") is brought into contact with the inner lead bond area and presses the individual beam leads against the chip's contacts to thermally compression-bond them.

TAB tapes generally are provided with sprocket holes whose purposes is to enable the feeding of the tape during chip placement and bonding. The sprocket holes usually have a form that is familiar from movie films and thus, prior art mechanisms used for transporting movie films have been used to transport TAB tapes. However, as TAB technology has moved in the direction of more leads and smaller spacings, such transport mechanisms have been found inadequate. When lead counts were low and lead widths were large, mechanical alignment using the sprocket holes was satisfactory. However, lead sizes today are on the order of two mil widths on four mil centers, and prior art sprocket positioning techniques are no longer adequate.

As a result, the semiconductor industry now employs optical alignment techniques (e.g., pattern recognition using solid state imaging cameras) to provide vernier positioning signals to enable precise location of chips on TAB lead frames. Precise mechanical alignment devices and thus joined with the optical system to enable the mechanical motion adjustments to be achieved.

A known mechanism for feeding strip materials is known as the hitch feeder. A hitch feeder usually includes a pneumatically operated slide, adjustable mechanical stops to control the stroke of the slide; grippers to grip the strip material that is attached to the slide; another gripper that is fixed in space that also grips the material; and a means for actuating the slide and grippers in a particular order. The hitch feeder propels material forward by gripping it with grippers attached to the slide and then actuating the slide.

The mechanical motion of the slide pulls material along, and when the slide reaches the end of its stroke, the gripper that is fixed in space grabs the material and the movable gripper is released. The slide is then actuated in the reverse direction and returns to its starting point. The material thus only travels on the forward stroke of the slide.

Examples of hitch feeders may be found in U.S. Pat. No. 3,753,522 to Voges; 3,791,567 to Schott Jr.; and 4,218,004 to Louse. Each of the aforementioned patents employs hitch feed devices for moving flexible webs. In each instance however, there is no requirement to register the web material with any other apparatus, nor to worry about conductors or other materials adhering to the surface of the web. Thus, each employs a gripping mechanism which, on the return stroke, enables one of the jaws of the gripping mechanism to be in contact with the web material. In U.S. Pat. No. 4,851,902 to Tezuka et al. an individual lead frame feed system is described which has vernier positioning provisions for the lead frames. Neither hitch feeding nor the handling of a continuous TAB tape is considered. Other references relevant to this technology are U.S. Pat. Nos. 4,194,673 to Elbert et al. and 3,937,388 to Zimmerman.

Accordingly, it is an object of this invention to provide a hitch feeder which enables precise alignment of features on a web.

It is another object of this invention to provide an improved hitch feeder which enables vernier adjustments to the position of the web, as it is being hitch fed.

It is a further object of this invention to provide an improved hitch feeder for handling TAB tapes.

It is yet another object of this invention to provide a hitch feeder for TAB tape which moves the tape without contact being made to circuit features on the tape.

SUMMARY OF THE INVENTION

A hitch feeder for a TAB tape is described which comprises: a stationary jaw assembly having opposing jaws for gripping edges of the tape when closed, and not gripping the edges when open; a movable gripping assembly which includes a lower movable gripper positioned below the tape and an upper movable gripper positioned above the tape. The lower and upper movable grippers may be moved both towards and away from the tape, each movable gripper gripping the tape when moved towards it and releasing the tape when moved away from it. Both grippers are physically clear of any features on the tape when moved away from it. A tape feeder is provided for reciprocally moving the movable gripper assembly along the tape length, both towards and away from the stationary jaw assembly. A feed control is operative when the movable gripping assembly moves towards the stationary jaw assembly, to move the gripper jaws to grip the tape and to open the opposing jaws, and is further operative when the movable gripper assembly moves away from the stationary jaw assembly, to move the gripper jaws away from the tape and to close the opposing jaws.

DETAILED DESCRIPTION OF THE INVENTION

Figure 1:
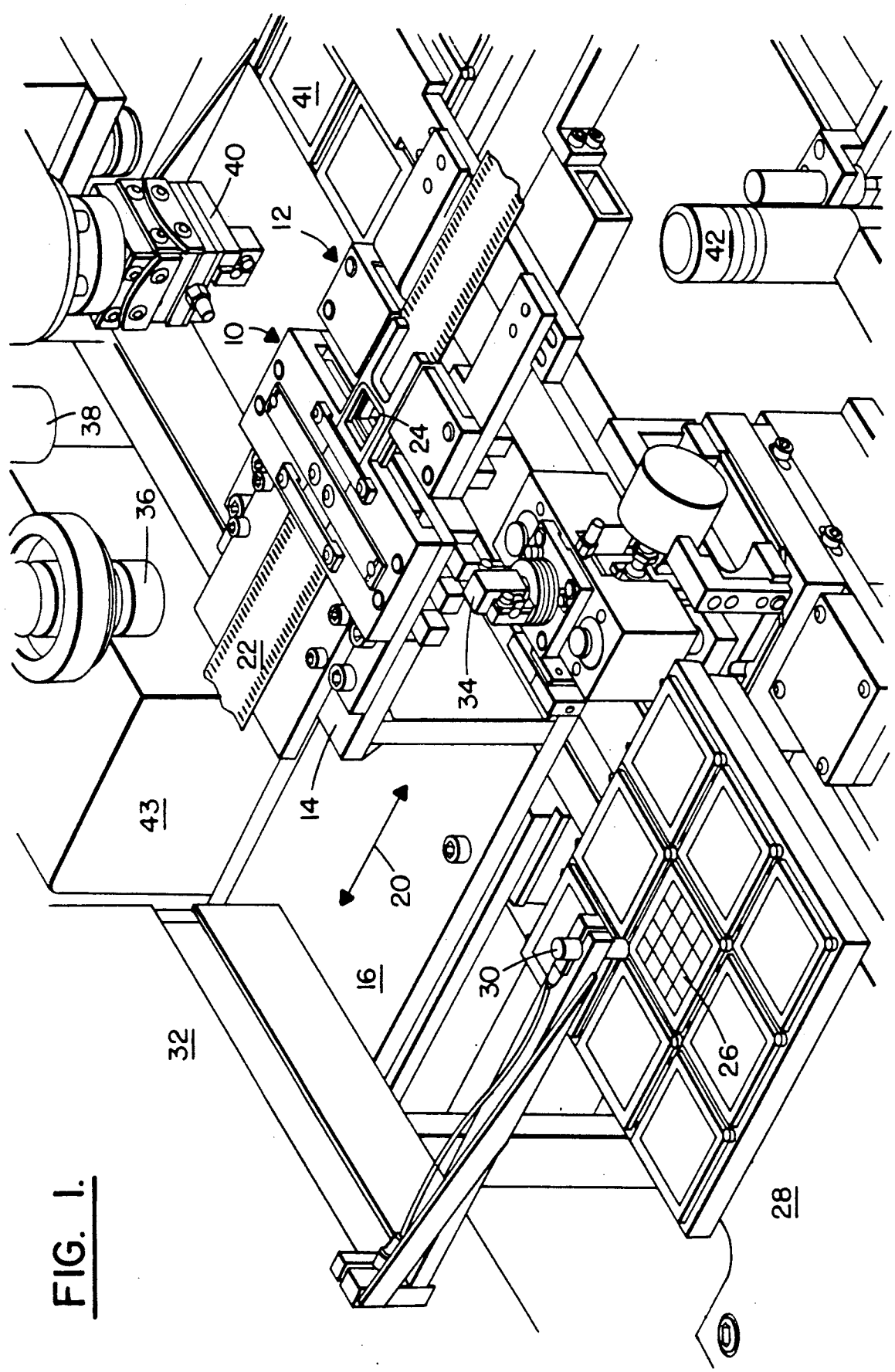
FIG. 1 is a partial perspective view of a chip placement and bonding machine which employs the hitch feeder of this invention.

Referring now to FIG. 1, the hitch feed mechanism includes two main parts, a movable gripper assembly 10 and a fixed jaw assembly 12. Movable gripper assembly 10 is mounted on a platform 14 which, in turn, is mounted on a slider plate 16 that is secured to a bidirectional rotary motor 18 (see FIG. 2). Motor 18 causes slider plate 16 to move reciprocally along the direction indicated by arrows 20. A TAB tape 22 is fed by the actions of movable gripper assembly 10, fixed jaw assembly 12 and slider plate 16 and thus increments its lead frames through a bonding window 24 in movable gripper assembly 10.

As each lead frame on TAB tape 22 is incremented into window 24 by the hitch feed mechanism, a chip is emplaced on the lead frame and bonded, (not shown in FIG. 1). Those chips are accessed from a waffle holder 26 which stores a plurality of prepositioned semiconductor chips. Waffle holders 26 are mounted on a movable table 28 which enables each holder to be moved beneath a vacuum head 30.

When a chip is in place on vacuum head 30, it is incremented by a mechanism 32 and moves to place the chip over a vacuum thermode 34. When vacuum head 30 is properly positioned over vacuum thermode 34, the chip is transferred to thermode 34 by turning on its vacuum supply and cutting off the vacuum to head 30.

A chip placed on vacuum thermode 34 is oriented so that its conductor pads are face up and ready for bonding. Vacuum thermode 34, in the position shown in FIG. 1, is in its uppermost travel position. After chip placement, it is moved down so that the chip is below the lowermost plane of movable gripper assembly 10. At such time the chip and thermode can be moved under gripper assembly 10 and placed in alignment with window 24. Once in alignment, thermode 34 is raised to bring the chip into contact with a lead frame on TAB tape 22.

A video camera 36 images the uppermost surface of vacuum thermode 34 and a chip held thereon. The image from video camera 36 is employed to enable reorientation of vacuum thermode 34 to properly align it with a lead frame in window 24. A second video camera 38 images each lead frame as it is brought into position in window 24. Its images enable a comparison to be made between the positions of the lead frame in window 24 and the chip on vacuum thermode 34 (as derived from video camera 36).

A second thermode 40 is positioned to the side and above the uppermost surface of movable gripper assembly 10. Thermode 40 can act as either a heated anvil during the bonding of a chip or as a vacuum thermode for a second semiconductor chip, if TAB tape 22 is to have chips bonded to both of its sides. In such latter case, a further waffle holder 41 and vacuum chip transport mechanism 43 are also provided, (but not shown in detail in FIG. 1). An additional video camera 42 is provided to view the lower-most surface of thermode 40, to enable its position to be accurately determined and controlled.

The details of construction of thermode 40 and its assembly can be found in U.S. Pat. No. 4,875,614 to Cipolla et al., assigned to the same assignee as is this application. The teachings of that patent are incorporated herein by reference. As can be understood therefrom, thermode 40 is constructed so as to be freely movable in pitch, yaw and roll so that it can completely adjust to the orientation of a lead bond frame, on the underside of which, a chip is positioned.

A description of a vacuum head and transfer mechanism for transferring chips from a waffle holder 26 to a vacuum thermode may be found in U.S. Pat. Application, Ser. No. 07/278,063, entitled Transfer Device, to Cipolla et al. and assigned to the same assignee as this application. The contents of that Application are also incorporated herein by reference.

In operation, a chip is removed from waffle holder 26 by vacuum head 30 and placed on vacuum thermode 34, while TAB tape 22 is being incremented to place a lead frame in window 24. The positions of the lead frame and chip are then determined from images derived by video cameras 36 and 38, and adjustments are made to the positions of thermode 34 and the lead frame to assure accurate alignment therebetween. Simultaneously, assuming that thermode 40 is to be used as a heated anvil, it's position is altered by a control system (to be described below), so that when it is positioned over window 24 and brought down into contact with the lead frame, that it is properly aligned.

As the alignments are being accomplished, vacuum thermode 34 is moved beneath window 24, and is then raised. A chip on its uppermost surface thus has its contact pattern placed into juxtaposition with a lead frame in window 24. Then thermode 40 is lowered and heat is applied to cause thermo-compression bonds between the beam leads and chip contacts. Thermodes 34 and 40 are then subsequently withdrawn, so that tape 22 can be incremented to place a new lead frame into window 24.

Figure 2:
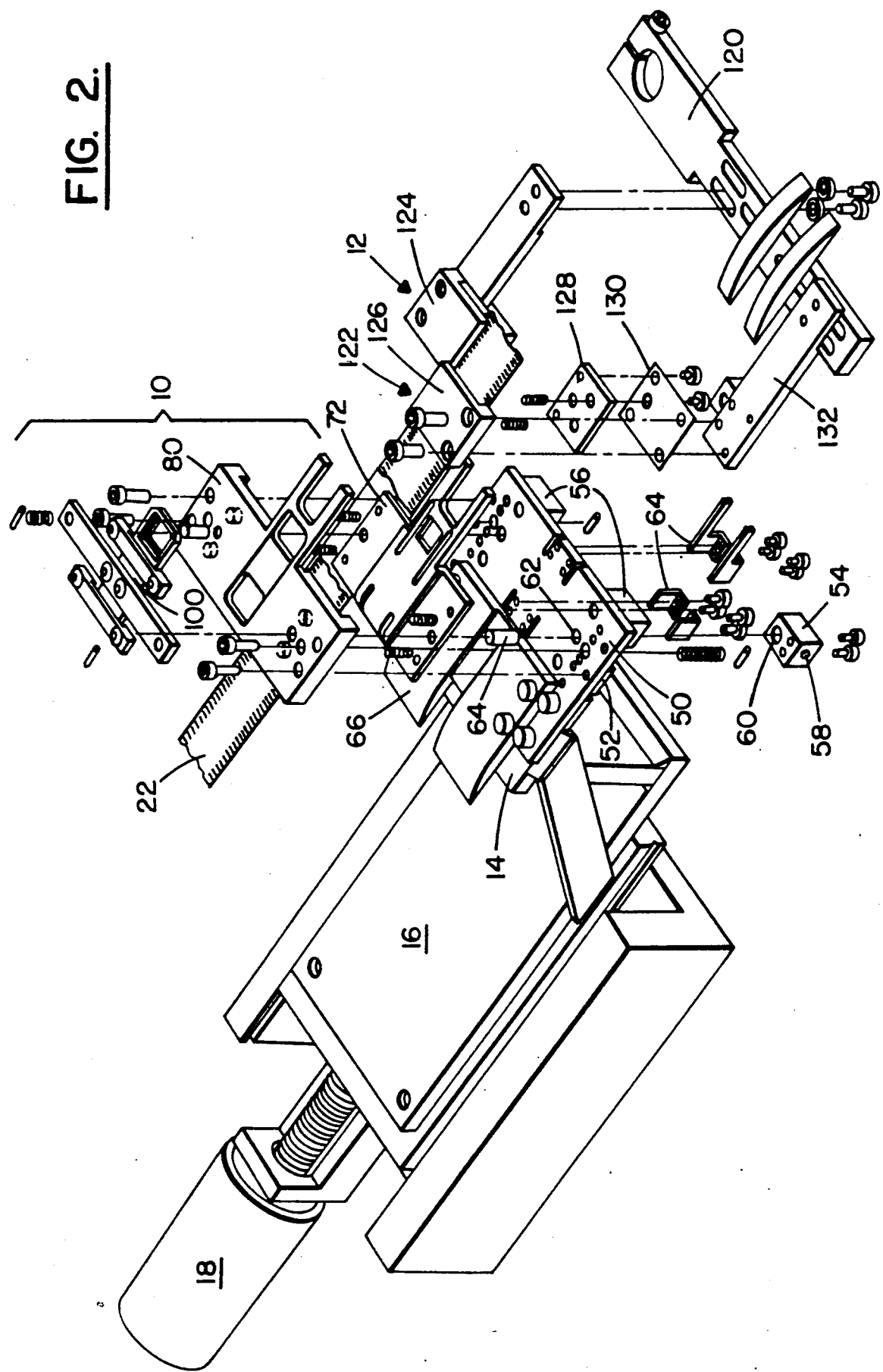
FIG. 2 is an exploded isometric of the hitch feeder mechanism.
Figure 3:
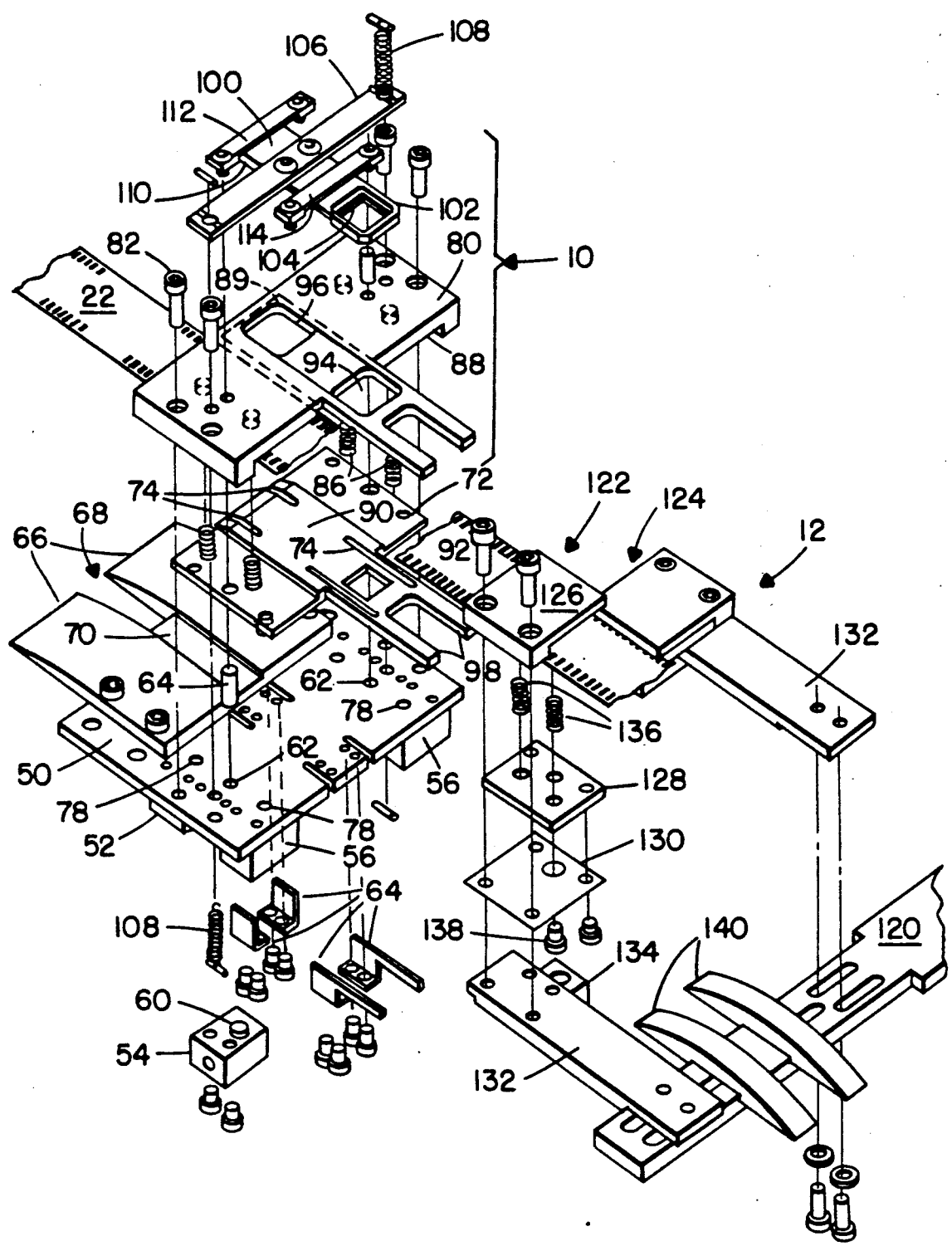
FIG. 3 is an exploded isometric view of a portion of the hitch feeder mechanism.

Turning now to FIGS. 2 and 3, the structure of the hitch feeder will further be described. It should be noted that illustrated structures are numbered identically in all figures of the drawings. Stationary gripper assembly 10 includes a base plate 50 that is fixed to platform 14 which is, in turn, connected via slider 16 to motor 18. Mounted on either side beneath base plate 50 are two sets of three air cylinders 52, 54, 56 which are employed during various portions of a hitch feed cycle. Air cylinder 54 is shown separated from base plate 50. Each air cylinder (e.g., 54) has an air fitting 58 and an actuating plunger 60. Each actuating plunger 60 is aligned with a thru-hole 62 in base plate 50, and is freely passable, therethrough Plungers 60 associated with air cylinders 54 interact with and control via pins 64, the movement of an upper gripper 100.

Mounted on the bottom of plate 50 are a plurality of tape-bearing rails 64 which extend through slots in plate 50 and above its top surface. A tail plate 66 is positioned on the upper surface of plate 50. The rear-projecting portions of tail plate 66 are aligned with the outer edges of TAB tape 22 and form a bearing surface therefor while it is being hitch-fed. An opening 68 and recessed portion 70 in tail plate 66 assure that no physical contact is made with the lead frames on tape 22 as it is being fed.

A lower movable gripper plate 72, in its open or lowermost position, rests on base plate 50 in front of tail plate 66. When in that position, the upper surface of gripper plate 72 lies beneath the surface of recessed area 70 on tail plate 66. Rail members 64 extend up through slotted openings 74 in gripper plate 74 and engage the outermost edges of TAB tape 22. In essence, they provide standoffs and bearing members for TAB tape 22 so that no lead frame on its underside touches the surface of movable gripper 72. At the four extremities of lower movable gripper 72 is a rest button 76, each of which rests upon a plunger extending through holes 78 in base plate 50.

Situated above lower movable gripper plate 72 is a stationary gripper plate 80 which is rigidly attached to base plate 50 by a plurality of screws 82. On the underside of stationary gripper plate 80 are four flat-bottom holes 84, into each of which is fitted a compression spring 86. Those springs act to bias lower movable gripper plate 72 away from stationary gripper plate 80 and to maintain a clearance between the lowermost surface 88 of stationary gripper plate 80 and the upper surface of lower movable gripper plate 72.

Upon actuation of air cylinders 52 and 56, lower movable gripper plate 72 is pushed upwardly against surface 88 of stationary gripper plate 80. When TAB tape 22 is positioned between stationary gripper plate 80 and lower movable gripper plate 72, it will rest in a channel 89 (FIG. 3) which is aligned therewith in lower surface 88. Additionally, when lower movable gripper plate 72 is moved upwardly, raised area 90 mates with channel 89 and forces TAB tape 22 into contact with the upper surface thereof.

Both gripper plates 72 and 80 are respectively provided with aligned openings 92 and 94 which, together, combine to provide a portion of window 24. It is to be noted that opening 94 is larger than opening 92. The reason for this will be discussed in relation to the description below of upper movable gripper plate 100. A further opening 96 is also provided in stationary gripper plate 80 whose function will also be described with respect to upper movable gripper plate 100. Both gripper plates 72 and 80 are provided with extension arms 98 which further support TAB tape 22 as it moves during the hitch feed operation.

Another element of movable gripper assembly 10 is upper movable gripper plate 100. A window 102 is formed in movable gripper plate 100 and has a downwardly extending frame 104 which, when gripper plate 100 is in its lowermost position, passes through opening 94 and bears upon the outer periphery of opening 92. Frame 104 thus presses the outer extremities of a lead frame on TAB tape 22 against the periphery of window 92.

A cross member 106 is connected to upper movable gripper plate 100 and is biased towards base plate 50 by springs 108. Gripper plate 100 is moved to its uppermost position when air cylinders 54 are energized., thereby causing pins 64 to rise and push upon the underside of cross member 106. When air cylinders 54 are deenergized, pins 64 recede and springs 108 cause movable gripper plate 100 to move to its lower-most "gripping" position and into engagement with the upper surface of stationary gripper plate 80. Beneath the rear-most portion of gripper plate 100 is a downward protrusion 110 which mates with and extends through opening 96 in stationary gripper plate 80. Protrusion 110 will cause tape 22 to be bent downwardly if it becomes crimped in channel 89 in stationary gripper plate 80. There are two additional cross members, 112 and 114 which are secured by offsets to the upper surface of stationary gripper plate 80 and adjust the uppermost travel position of upper movable gripper plate 100.

The operation of movable gripper assembly 10 can now be understood by realizing that it has two essential positions, i.e., gripping and non-gripping. In the gripping position, air cylinders 52 and 56 force lower movable gripper plate 72 up against the bottom surface of stationary gripper plate 80. Furthermore, air cylinders 54 are deenergized, thereby enabling upper movable gripper plate 100 to move down and contact the upper surface of stationary gripper plate 80. As a result, frame 104 of window 102 bears upon TAB tape 22 causing a lead frame within window 24 to be firmly gripped around its edges. In addition, protrusion 110 extends through opening 96 and bears down upon a following portion of TAB tape 22 thereby flattening it against surface 90.

In the non-gripping position, air cylinders 52 and 56 are deenergized and springs 86 bias lower movable gripping plate 72 away from TAB tape 22 and against base plate 50. Rails 64 extend up through lower movable gripping plate 72 and support the outer extremities of TAB tape 22. During the non-gripping phase, air cylinders 54 are energized, causing pins 64 to extend and move upper movable gripper plate 100 away from the upper surface of stationary gripper plate 80. Thus, it can be seen that during the non-gripping phase, both the upper and lower gripping plates are moved away from TAB tape 22 so that it can be incremented, and neither its upper nor lower lead frame bearing surfaces contact any lead frame members. This is critical due to the fragility of the leads.

Stationary jaw assembly 12, shown to the right of both FIGS. 2 and 3, is mounted on a fixed arm 120. It includes a pair of opposing jaw pairs 122 and 124, each of which includes an upper jaw 126 and a lower jaw 128. Lower jaw 128 is fixed to a leaf spring 130, which is, in turn, mounted on extension arm 132. An air cylinder 134 is mounted on the other underside of extension 132 and provides the actuating force to close a set of jaw pairs 122 and 124. A pair of springs 136 normally bias jaws 126 and 128 apart from each other. However; when air cylinder 134 is energized, its piston acts upon a rest button 138 which, in turn, acts upon lower jaw 128 to cause it to move upwardly and grasp an edge of TAB tape 22. Both stationary jaws 122 and 124 act simultaneously. A pair of fixed rails 140 support the outer edges of TAB tape 22 as it passes through stationary jaw assembly 12.

Figure 4:
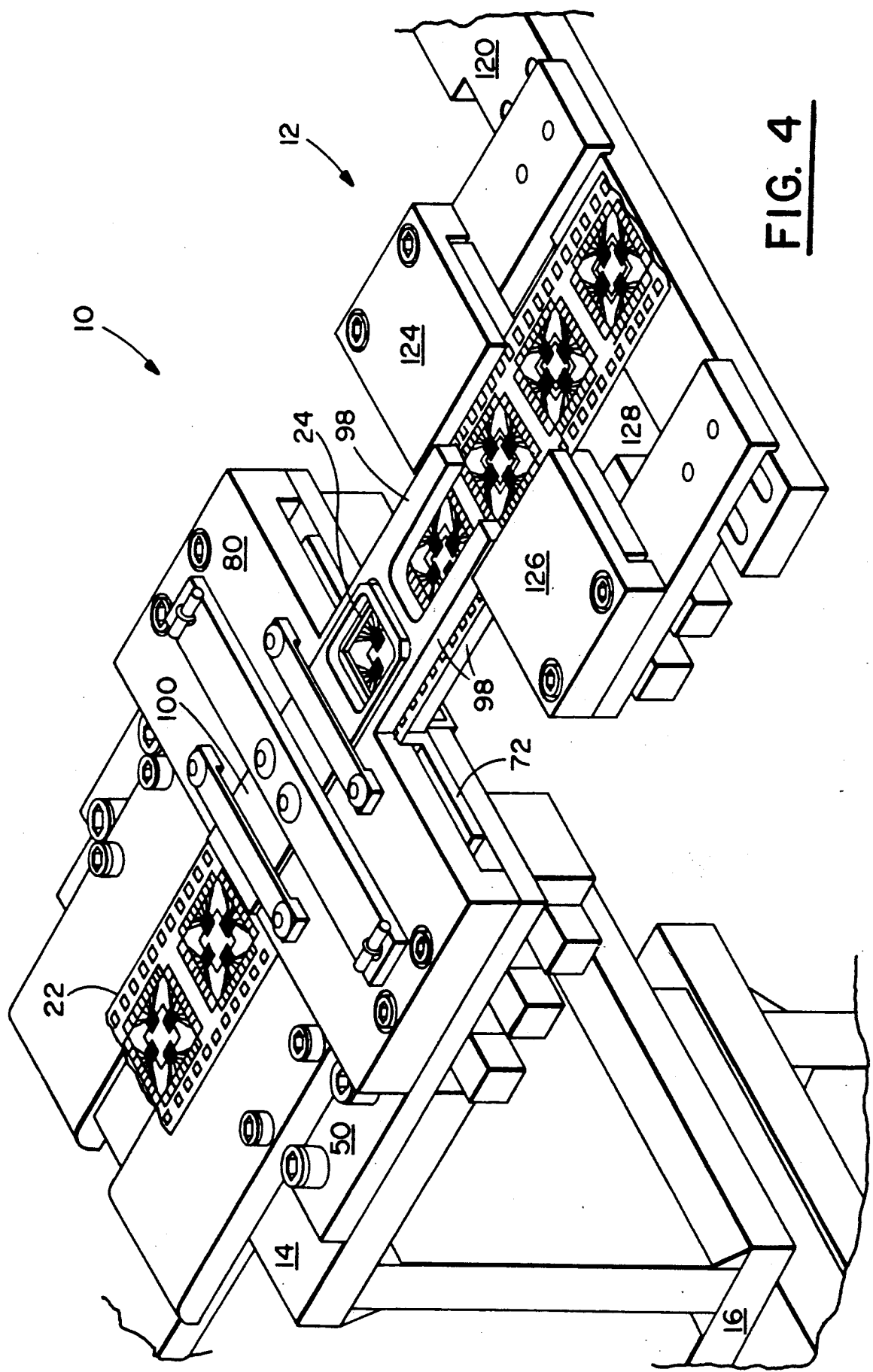
FIG. 4 is a partial isometric view of the hitch feeder prior to the movable grippers being moved to increment a TAB tape through a pair of stationary jaws.
Figure 5:
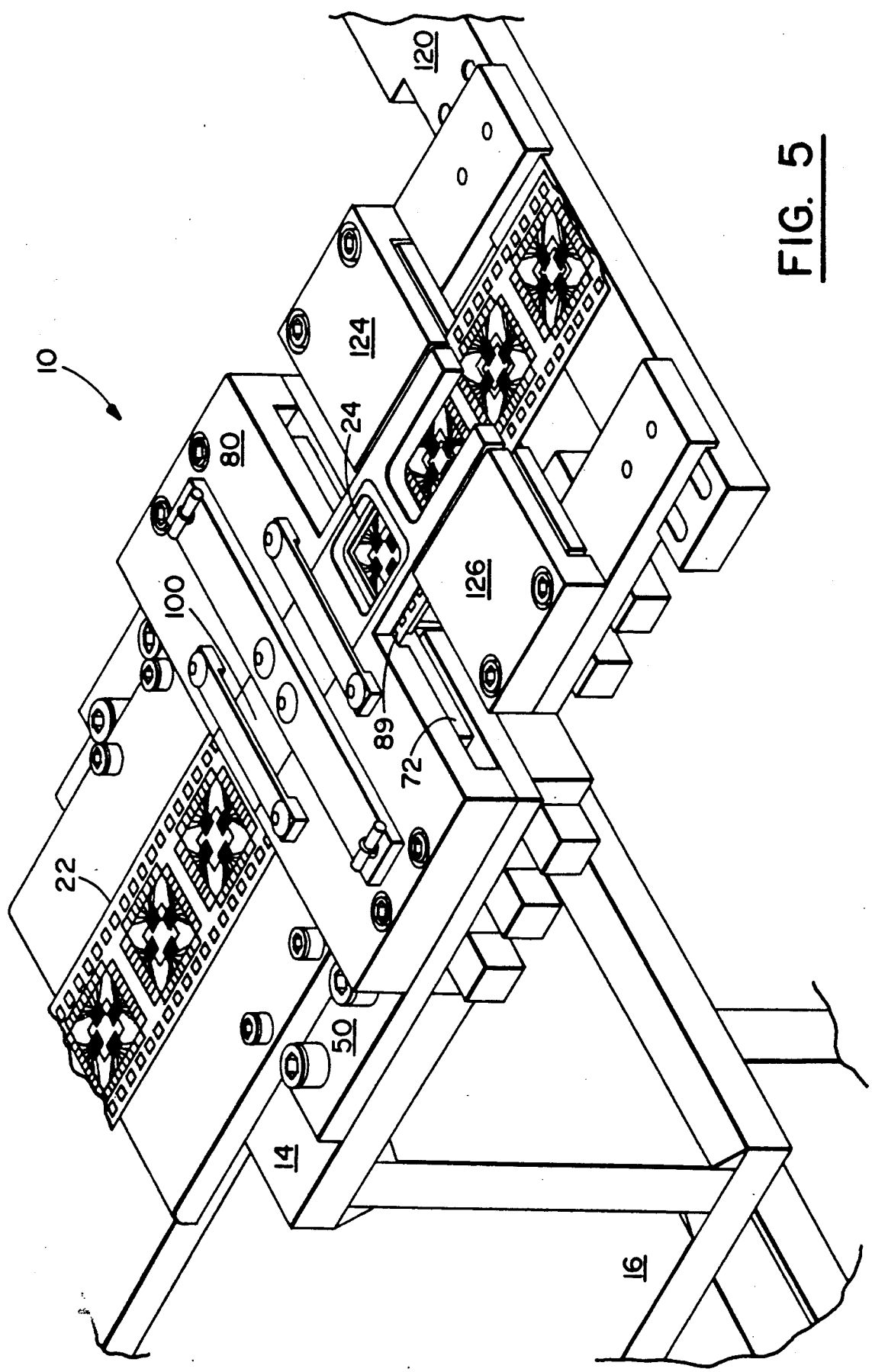
FIG. 5 is a partial isometric view of the hitch feeder of FIG. 4 after the movable grippers have been closed and incremented to move the TAB tape through the fixed jaws.

Turning now to FIGS. 4 and 5, the operation of the hitch feeder will be described in further detail. In FIG. 4, a lead frame on TAB tape 22 (in window 24) has not yet been incremented into the bonding position. Thus, lower and upper movable grippers 72 and 100 are, respectively, in their lower most and upper most travel positions, and TAB tape 22 is not engaged thereby. Fixed jaws 124 and 126 are, however, closed and grip TAB tape 22. It is to be noted that arms 98 provide guides for TAB tape 22 between movable gripper assembly 10 and fixed jaw assembly 12.

As shown in FIG. 5, TAB tape 22 is positionally incremented by causing lower movable gripper 72 to move up and into engagement with stationary gripper plate 80, thereby urging TAB tape 22 against the lower most surface of channel 89 in the underside of stationary gripper plate 80. Upper movable gripper plate 100 is simultaneously lowered and bears upon the lead frame in window 24. At the same time, stationary jaws 124 and 126 are opened. Then, movable gripper assembly 10 is moved to the right and increments TAB tape 22 and the lead frame in window 24 into the bonding position. At this stage, a semiconductor chip is brought up beneath TAB tape 22 and is bonded thereto through the aforedescribed action.

Subsequent to the bonding action, stationary jaws 124 and 126 are closed; lower and upper movable grippers 72 and 100 are opened and movable gripper assembly 10 is moved to the left to ready it for the next cycle. It can be seen that TAB tape 22 will not move when this occurs, as it is held in place by jaws 124 and 126.

As aforestated with respect to FIG. 1, video camera 38 examines each lead frame as it is brought into the bonding area as shown in FIG. 5. At the end of each feed stroke, the position of the lead frame is examined by a controller connected to video camera 38 and the position of the lead frame is compared with a pre-stored lead frame model. To the extent that the lead frame on TAB tape 22 positionally varies from the model (in the direction of feed of TAB tape 22), a control signal is sent to motor 18 to cause it to move by a vernier amount so as to reposition movable gripper assembly 10 to achieve a best "fit" between the lead frame and the stored model.

Figure 6:
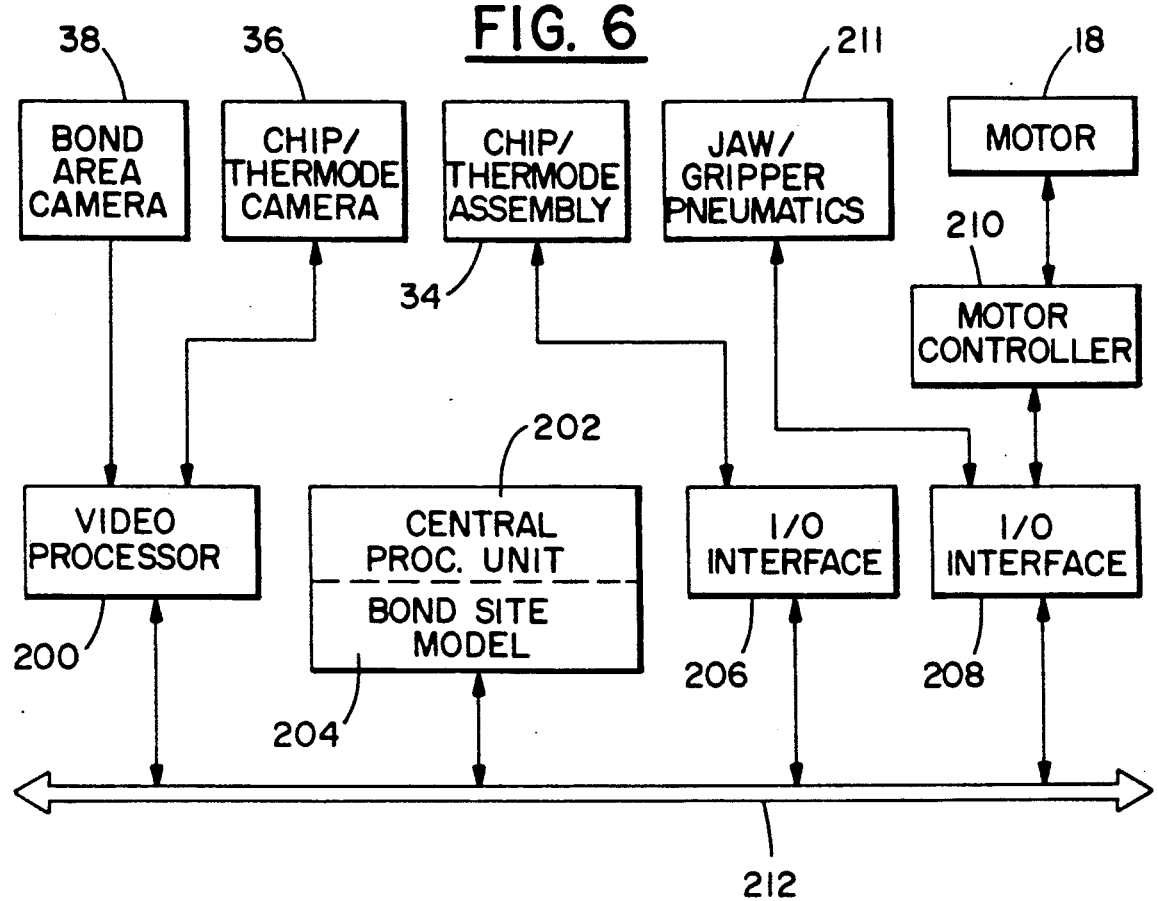
FIG. 6 is a high level block diagram showing the control system for the invention.

Referring now to FIG. 6, a high level block diagram of the control electronics for the system of FIGS. 1-5 is illustrated. Chip/thermode camera 36 and lead bond camera 38 both feed their images into video processor 200 where the analog images are converted to digital images. A central processing unit 202 has a lead frame model 204 stored therein, against which it compares the digital images from video processor 200. Subsequent to those comparisons, correction instructions are fed via I/O interface 206 to chip/thermode assembly 34 and, via I/O interface 208 to motor controller 210 which in turn responds by causing motor 18 to either increment TAB tape 22 to the next lead frame or to apply a vernier motion correction thereto. Similar signals are sent to jaw/gripper pneumatics 211 to synchronize the operation thereof with that of motor 18. In the well-known manner, a bus 212 connects all of the aforementioned units and provides communications therebetween.

Figure 7:
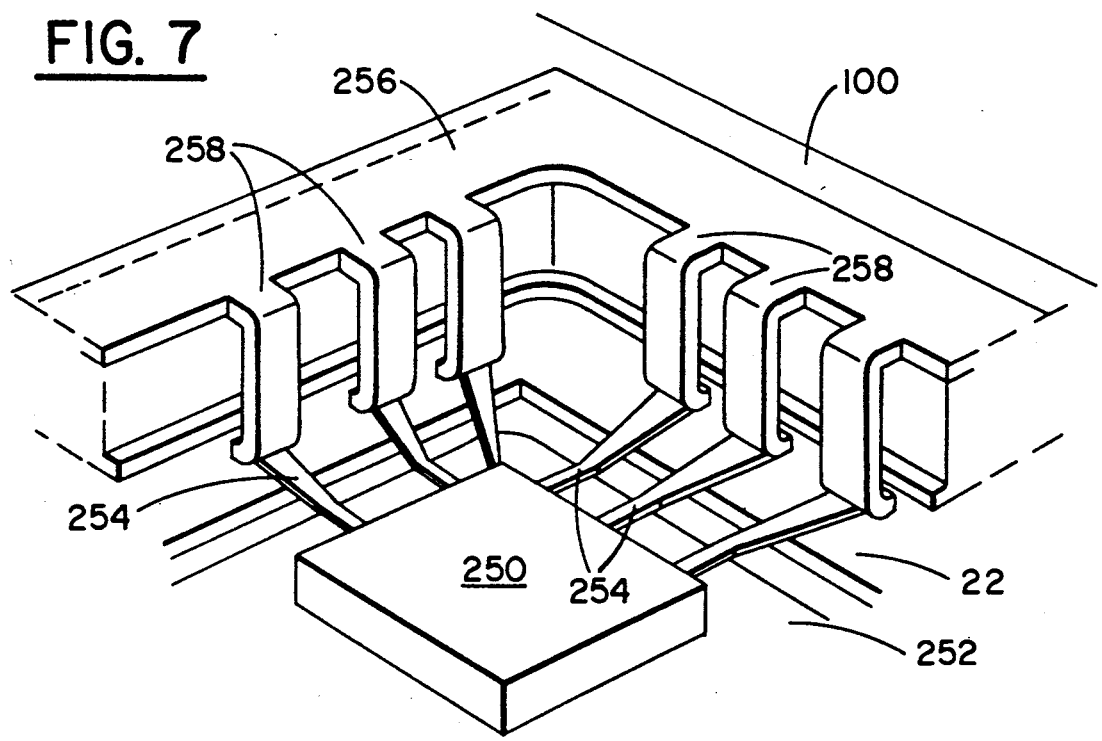
FIG. 7 is a partial isometric view showing a heat sink which prevents heat transfer into the TAB tape when chip bonding is occurring.

Turning now to FIG. 7, a modification to the upper movable gripper 100 is illustrated which prevents undo heat build-up in TAB tape 22 during bonding. In this instance, it is assumed that a chip 250 has been placed on the upper surface of TAB tape 22 and that a lower heating anvil 252 has been brought up to push beam leads 254 against bonding areas on the lower side of chip 250. Since anvil 252 is heated to a relatively high temperature, heat transfer occurring through leads 254 into TAB tape 22 can damage the tape. To prevent such, a heat sink 256 is connected to the upper side of upper movable gripper 100 and has a plurality of fingers 258 which are bent downwardly and engage each of beam leads 254. As a result, the heat induced therein during bonding is removed by fingers 258 and dissipated by the upper surface of heat sink 256.

Heat sink 256 is constructed of a very thin metal so that fingers 258 are highly flexible and sufficiently supple so that when upper movable gripper 100 is brought into contact with TAB tape 22, that fingers 258 flex and do not damage the upper surfaces of beam leads 254.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A hitch feeder for a TAB tape, said tape having an elongated length and a plurality of conductive lead frames positioned along said length, each frame adapted to receive a semiconductor chip on conductive leads adherent to said tape, the combination comprising:
    a stationary assembly having opposing jaws for gripping edges of said tape when closed and not gripping said edges when open;
    a movable gripper assembly, including lower movable gripper means positioned below said tape and upper movable gripper means positioned above said tape, both towards and away from said tape, said upper and lower movable gripper means gripping said tape when moved towards it and releasing said tape when moved away from it, both said lower and upper movable gripper means being physically clear of said lead frames when moved away from said tape;
    tape feed means for reciprocally moving said movable gripper assembly along said tape length, both towards and away from said stationary jaw assembly; and
    feed control means, operative when said movable gripper assembly moves towards said stationary jaw assembly, to move said upper and lower gripper means to grip said tape and to open said opposing jaws, and further operative when said movable gripper assembly moves away from said stationary assembly, to move said upper and lower gripper assembly away from said tape and to close said opposing jaws.

2. The hitch feeder as recited in claim 1 wherein said movable gripper assembly further comprises:
    stationary gripper means, stationary with respect to said upper and lower movable gripper means having a channel aligned with said TAB type for receiving and guiding said TAB tape; and
    plate means disposed on said lower movable gripper means for pressing said TAB tape into and against a surface of said channel when moved to grip amid tape.

3. The hitch feeder as recited in claim 2 wherein said plate means is planar in shape and spans the width of said channel to thereby support said TAB tape when said lower movable gripper means is brought into engagement with said stationary gripper means.

4. The hitch feeder as recited in claim 3 wherein said lower movable gripper means has a window which exposes a lead bond frame in said TAB tape.

5. The hitch feeder as recited in claim 4 further comprising:
    rail means extending through openings in said lower movable gripper means for supporting said tape edges when said lower movable gripper means is moved away from said tape.

6. The hitch feeder as recited in claim 5 wherein said stationary gripper means and upper movable gripper means have lead frame exposing windows aligned with the window in said lower movable gripper means, said upper movable gripper means having a frame portion disposed about its window which, when said upper movable gripper means is moved toward said tape, to contact the periphery of said lead frame and press it against said lower movable gripper means.

7. The hitch feeder as recited in claim 6 wherein said stationary gripper means has a further window exposing an area of said tape, and said upper movable gripper means has a protrusion aligned with said window, said protrusion bearing upon said tape to prevent curling thereof when said upper movable gripper means moves to grip said tape.

8. The hitch feeder as recited in claim 7 further comprising:
spring means for biasing said lower movable gripper means away from said stationary gripper means and for biasing said upper movable gripper means toward said stationary gripper means; and
pneumatic means for moving said lower movable gripper means towards said tape and for moving said upper movable gripper means away from said tape.

9. The hitch feeder as recited in claim 8 further comprising: rail means associated with said stationary jaw aseembly for supporting the edges of said tape.

10. The hitch feeder as recited in claim 9, said stationary jaw assembly further comprising:
resilient means supporting one jaw of said opposing jaws;
spring means for biasing said jaws open; and
pneumatic means for moving said resilient means against said spring means bias, to cause said jaws to grip about tape edges.

11. The hitch feeder as recited in claim 1 wherein said tape feed means, movable gripper assembly and stationary jaw assembly are operative to repeatedly bring successive TAB tape lead frames into a chip bonding area, said feed control means further comprising:
camera means for viewing each said TAB tape lead frame in said chip bonding area; and
processor means responsive to an input from said camera means, for providing an adjustment signal to said tape feed means to cause a vernier repositioning of a TAB tape lead frame in said chip bonding area.

12. The hitch feeder as recited in claim 11 wherein said processor means includes means for storing a model of a lead frame and means for comparing said input from said camera means with said model to derive a position error signal, said vernier repositioning occurring as a result of said position error signal.

13. The hitch feeder as recited in claim 12 wherein said lower movable gripper means has a window which exposes a lead frame on said TAB tape.

14. The hitch feeder as recited in claim 13 wherein said movable gripper assembly is further provided with a stationary gripper means, said stationary gripper means and upper movable gripper means having lead frame exposing windows aligned with the window in said lower movable gripper means, to enable said camera means to view a lead frame, said upper movable gripper means having a frame portion disposed about its window which, when said upper movable gripper means is moved towards said tape, to contact the periphery of said lead frame and press it against said lower movable gripper means.

15. The hitch feeder as recited in claim 1 wherein said tape feed means, movable gripper assembly and stationary jaw assembly are operative to repeatedly bring successive TAB tape lead frames into a chip bonding area, said movable gripper assembly further comprising:
heat sink means positioned to engage each said lead frame in said clip bonding area, to thereby prevent a heat build-up in said TAB tape during bonding.

16. The hitch feeder as recited in claim 15 wherein said heat sink means comprises:
a plurality of flexible conductive members mounted on said upper movable gripper means, said conductive members positioned to engage a lead frame in said bonding area when said upper movable gripper means is moved towards said tape.

* * * * *